United States Patent
Liang

(10) Patent No.: US 11,309,425 B2
(45) Date of Patent: Apr. 19, 2022

(54) FIELD EFFECT TRANSISTOR HAVING SOURCE CONTROL ELECTRODE, MANUFACTURING METHOD THEREOF AND ELECTRONIC DEVICE

(71) Applicants: BEIJING HUA TAN YUAN XIN ELECTRONICS TECHNOLOGY CO., LTD, Beijing (CN); BEIJING HUATAN TECHNOLOGY CO., LTD., Beijing (CN)

(72) Inventor: Shibo Liang, Beijing (CN)

(73) Assignees: BEIJING HUA TAN YUAN XIN ELECTRONICS TECHNOLOGY CO., LTD, Beijing (CN); BEIJING HUATAN TECHNOLOGY CO., LTD, Beijing (CN)

( * ) Notice: Subject to any disclaimer, the term of this patent is extended or adjusted under 35 U.S.C. 154(b) by 0 days.

(21) Appl. No.: 16/772,751

(22) PCT Filed: Oct. 17, 2018

(86) PCT No.: PCT/CN2018/110633
§ 371 (c)(1),
(2) Date: Jun. 12, 2020

(87) PCT Pub. No.: WO2019/114409
PCT Pub. Date: Jun. 20, 2019

(65) Prior Publication Data
US 2020/0321471 A1    Oct. 8, 2020

(30) Foreign Application Priority Data

Dec. 14, 2017   (CN) .......................... 201711339629.9

(51) Int. Cl.
*H01L 29/786* (2006.01)
*H01L 29/06* (2006.01)
(Continued)

(52) U.S. Cl.
CPC .... *H01L 29/78618* (2013.01); *H01L 29/0673* (2013.01); *H01L 29/458* (2013.01); *H01L 29/66742* (2013.01); *B82Y 10/00* (2013.01)

(58) Field of Classification Search
CPC ........... H01L 29/78618; H01L 29/0673; H01L 29/458; H01L 29/66742; H01L 29/66356;
(Continued)

(56) References Cited

U.S. PATENT DOCUMENTS 5,831,329 A * 11/1998 Marso .................... B82Y 10/00
257/750
2012/0181509 A1 * 7/2012 Liang ................ H01L 29/66742
257/29

(Continued)

FOREIGN PATENT DOCUMENTS

CN      102468333 A      5/2012
CN      105027294 A     11/2015
(Continued)

OTHER PUBLICATIONS

International Search Report and Written Opinion of the International Searching Authority issued in PCT/CN2018/110633, dated Jan. 16, 2019; ISA/CN.

(Continued)

*Primary Examiner* — Edward Chin
(74) *Attorney, Agent, or Firm* — Harness, Dickey & Pierce, P.L.C.

(57) ABSTRACT

A field effect transistor, a method of manufacturing the field effect transistor, and an electronic device are provided, wherein the field effect transistor comprises: a source(105) formed of a Dirac material(103) and a drain(107); a channel (102) disposed between the source(105) and the drain(107); and a source control electrode(108) disposed on the source (105) and for controlling the doping of the Dirac material
(Continued)

(103) such that the Dirac material(103) and the channel(102) are doped in an opposite manner; and a gate(106) disposed on the channel(102) and electrically insulated from the channel(102).

23 Claims, 14 Drawing Sheets

(51) Int. Cl.
*H01L 29/45* (2006.01)
*H01L 29/66* (2006.01)
*B82Y 10/00* (2011.01)

(58) Field of Classification Search
CPC ............... H01L 29/267; H01L 29/7391; H01L 29/66772; H01L 51/0512; H01L 29/78696; H01L 29/45; H01L 29/66227; H01L 29/786; B82Y 10/00
See application file for complete search history.

(56) References Cited

U.S. PATENT DOCUMENTS

| | | |
|---|---|---|
| 2012/0184075 A1 | 7/2012 | Domenicucci et al. |
| 2014/0239257 A1 | 8/2014 | Moon |
| 2015/0280012 A1* | 10/2015 | Sato ................... H01L 29/1606 257/29 |
| 2017/0040443 A1 | 2/2017 | Lemaitre et al. |
| 2017/0133279 A1 | 5/2017 | Peng |
| 2019/0097000 A1* | 3/2019 | Berry ................ H01L 21/02381 |
| 2019/0157272 A1* | 5/2019 | Oishi ................ H01L 29/78639 |
| 2019/0319134 A1* | 10/2019 | Chen ..................... H01L 29/786 |
| 2019/0393333 A1* | 12/2019 | Fujita .................. H01L 29/7397 |
| 2020/0328283 A1* | 10/2020 | Liang ..................... H01L 29/45 |

FOREIGN PATENT DOCUMENTS

| | | | |
|---|---|---|---|
| CN | 105866984 A | | 8/2016 |
| CN | 106256023 A | | 12/2016 |
| CN | 106356405 A | * | 1/2017 |
| CN | 107994078 A | | 5/2018 |
| JP | 2015018961 A | * | 1/2015 |
| KR | 20170079643 A | | 7/2017 |
| WO | WO-2019114409 A1 | | 6/2019 |

OTHER PUBLICATIONS

First Office Action isssued in 201711339629.9, dated Dec. 16, 2019 (with English Translation).

* cited by examiner

FIELD EFFECT TRANSISTOR HAVING SOURCE CONTROL ELECTRODE, MANUFACTURING METHOD THEREOF AND ELECTRONIC DEVICE

CROSS-REFERENCE TO RELATED APPLICATIONS

This application is a U.S. National Phase application based upon PCT Application No. PCT/CN2018/110633, filed on Oct. 17, 2018, which claims the priority of Chinese Patent Application No. 201711339629.9, filed on Dec. 14, 2017, and the disclosures of which are hereby incorporated by reference.

FIELD

The present disclosure relates to the field of a semiconductor device, and more particularly to a field effect transistor having a source control electrode, a method for manufacturing a field effect transistor having a source control electrode, and an electronic device

BACKGROUND

Metal-oxide-semiconductor field effect transistors (MOS FETs) are the basic elements for constructing integrated circuits. Transition of the switching state of a device is achieved by applying a voltage across the gate to control the source-drain current of the MOS FET. The turn-off speed is described by the sub-threshold swing (SS) referring to the gate voltage increment, which needs to be applied to vary the source leakage current by an order of magnitude. The smaller the sub-threshold swing is, the faster the transistor turns off. Due to the limitation of the thermal excitation mechanism, the theoretical minimum value of the sub-threshold swing of a conventional FET at room temperature is 60 mV/Dec. Further development of integrated circuits requires that the operating voltage continue to decrease, while the thermal excitation limit of 60 mV/Dec for the sub-threshold swing in MOS FETs limits the operating voltage of integrated circuits to no less than 0.64V, limiting further decrease of the power consumption of integrated circuits. Therefore, to further promote the development of the complementary metal-oxide-semiconductor (CMOS) technology and realize ultra-low-power-consumption integrated circuits, the limitation of the sub-threshold swing by the thermal excitation mechanism for conventional MOS FETs has to be overcome to implement transistors with a sub-threshold swing less than 60 mV/Dec.

There are mainly two types of transistors that can achieve a sub-threshold swing less than 60 mV/Dec: one is tunnel transistors (Tunnel FETs), and the other is negative capacitance transistors. A heavily doped np tunnel junction is formed in the channel of a tunnel transistor, through interband tunneling can the carrier be transported from the source to the drain, and the thickness of the tunnel junction is adjusted by the gate voltage to control the tunnel current, to realize the transition of the switching state of the transistor. When the tunnel transistor is turned off, the physical limit of the thermal excitation on the turn-off speed in the conventional FET device can be broke through, achieving a sub-threshold swing of less than 60 mV/Dec at room temperature. However, the presence of the tunnel junction also greatly reduces the drive current of the tunnel transistor, and the maximum on-state current of the tunnel transistor currently achieved is only 1% of that of a normal transistor. Specifically, the maximum current of a tunnel transistor with a sub-threshold swing less than 60 mV/Dec at room temperature is 1-10 nA/μm. The current does not meet the requirements of the International Technology Roadmap for Semiconductors (ITRS), and causes the operation speed of device and the circuit to reduce significantly, failing to meet the operation needs of a normal integrated circuit, and thus have no practical application. A negative capacitance transistor generally uses ferroelectric materials as gate capacitances, which can achieve a sub-threshold swing below 60 mV/Dec and high drive currents, but a negative capacitance transistor has the disadvantages of a slow speed, poor stability and difficult integration.

BRIEF SUMMARY

According to a first aspect of the present disclosure, a field effect transistor is provided, which comprises: a source and a drain, the source being formed of Dirac materials; a channel disposed between the source and the drain; the source control electrode disposed on the source and for controlling doping of the Dirac material such that the Dirac material and the channel are doped in an opposite manner; and a gate disposed over the channel and electrically insulated from the channel.

According to at least one embodiment according to the present disclosure, the Dirac material comprises: a single layer of graphene, a Weyl semimetal, a d-wave superconductor, or a topological insulator.

According to at least one embodiment according to the present disclosure, the source is in electrical contact with the channel.

According to at least one embodiment according to the present disclosure, the source control electrode is configured to cause the contact barrier height between the source and the channel to be less than 0.2 electron volts.

According to at least one embodiment according to the present disclosure, the channel is p-type doped, and the source control electrode is configured to cause the Dirac material to be n-type doped; or the channel is n-doped, and the source control electrode is configured to cause the Dirac material to be p-type doped.

According to at least one embodiment according to the present disclosure, the field effect transistor further comprises a gate insulating layer formed on the channel and having an equivalent oxide thickness of less than 2 nm.

According to at least one embodiment according to the present disclosure, the field effect transistor further comprises a source control electrode insulating layer formed between the source and the source control electrode.

According to at least one embodiment according to the present disclosure, the field effect transistor further comprises a source control electrode insulating layer formed between the source and the source control electrode, and the source control electrode insulating layer and the gate insulating layer being formed of the same layer of material.

According to at least one embodiment according to the present disclosure, the drain and the channel are formed of the same layer of material.

According to at least one embodiment according to the present disclosure, the drain is formed of the Dirac material.

According to at least one embodiment according to the present disclosure, the channel is formed of at least one of carbon nanotubes, semiconductor nanowires, two-dimensional semiconductor materials, or three-dimensional semiconductor materials.

According to a second aspect of the present disclosure, a method for manufacturing a field effect transistor having a source control electrode is provided, which comprises: forming a channel on a substrate; forming a source and a drain on the substrate such that the channel is located between the source and the drain, the source being formed of a Dirac material; forming, on the source, a source control electrode for controlling doping of the Dirac material such that the Dirac material and the channel are doped in an opposite manner; and forming a gate on the channel such that a projection of the gate on the substrate overlaps with a projection of the channel on the substrate, and the gate and the channel are electrically insulated.

According to at least one embodiment according to the present disclosure, the Dirac material comprises: a single layer of graphene, a Weyl semimetal, a d-wave superconductor, or a topological insulator.

According to at least one embodiment according to the present disclosure, the step of forming a source and a drain on the substrate further comprises electrically contacting the source with the channel.

According to at least one embodiment according to the present disclosure, the source control electrode is configured to cause the contact barrier height between the source and the channel to be less than 0.2 electron volts.

According to at least one embodiment according to the present disclosure, the channel is p-type doped, and the source control electrode is configured to cause the Dirac material to be n-type doped; or the channel is n-doped, and the source control electrode is configured to cause the Dirac material to be p-type doped.

According to at least one embodiment according to the present disclosure, the method further comprises forming a gate insulating layer over the channel, the gate insulating layer having an equivalent oxide thickness less than 2 nm.

According to at least one embodiment according to the present disclosure, the method further comprises forming a source control electrode insulating layer on the source, the source control electrode insulating layer being disposed between the source and the source control electrode.

According to at least one embodiment according to the present disclosure, the method further comprises forming a source control electrode insulating layer on the source, the source control electrode insulating layer being formed between the source and the source control electrode, and the source control electrode insulating layer and the gate insulating layer being formed of the same layer of material.

According to at least one embodiment according to the present disclosure, the drain and the channel are formed of the same layer of material.

According to at least one embodiment according to the present disclosure, the drain is formed of the Dirac material.

According to at least one embodiment according to the present disclosure, the channel is formed of at least one of carbon nanotubes, semiconductor nanowires, two dimensional semiconductor materials, or three-dimensional semiconductor materials.

According to the third aspect of the present disclosure, an electronic device is provided, which comprises a field effect transistor having a source control electrode, the field effect transistor having a source control electrode comprises: a source and a drain, the source being formed of a Dirac material; a channel disposed between the source and the drain; a source control electrode disposed on the source and for controlling doping of the Dirac material such that the Dirac material and the channel are doped in an opposite manner; and a gate disposed on the channel and electrically insulated from the channel.

BRIEF DESCRIPTION OF THE DRAWINGS

The drawings show exemplary embodiments of the present disclosure and are used together with the description for explaining the principle of the present disclosure. The drawings are included to provide a further understanding of the present disclosure, are included in the Description and constitute a part of the Description.

FIGS. 11A-1B exemplarily illustrate the sub-steps of providing the Dirac material for forming the source on a substrate according to an embodiment of the present disclosure.

DETAILED DESCRIPTION

Figure 1:
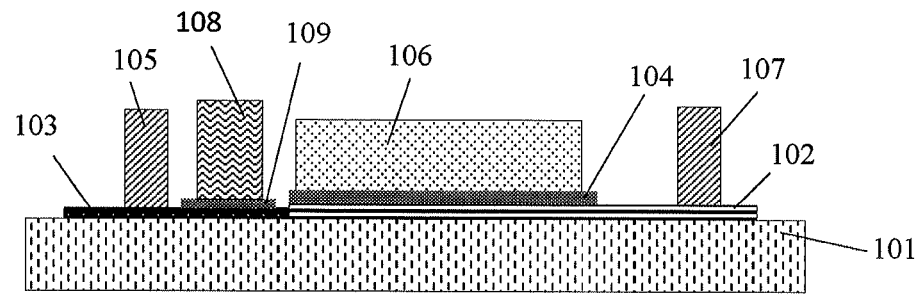
FIG. 1 exemplarily illustrates the schematic diagram of the structure of a field effect transistor according to an embodiment of the present disclosure.

The present disclosure will be further described in detail below with reference to the drawings and embodiments. It should be understood that the specific embodiments described herein are intended to explain relevant contents but not limit the present disclosure. It should also be noted that, for the convenience of description, only the parts related to the present disclosure are shown in the drawings.

It should be further noted that the embodiments in the present disclosure and the features in the embodiments may be combined with each other in the case of no conflict. The present disclosure will be described in detail below with reference to the drawings in combination with the embodiments.

FIG. 1 exemplarily illustrates a schematic diagram of the structure of a field effect transistor according to an embodiment of the present disclosure. As shown in FIG. 1, the field effect transistor according to an embodiment of the present disclosure may be formed on substrate 101. The rigidity of substrate 101 is sufficient to support the device during the operation of manufacturing. Substrate 101 can be an amorphous or crystalline material. By way of example, substrate 101 can be glass, sapphire, silicon, polymer, silicon on insulator, or any other substrate on which an insulating layer can be deposited. Embodiments of the present disclosure are not limited to the above-described substrates because the semiconductor properties of the field effect transistors according to the embodiments of the present disclosure are not dependent on the semiconductor properties of these substrates.

Material 102 for forming a channel may be disposed on substrate 101. Material 102 has the electrical properties of a semiconductor. For example, the material 102 may comprise carbon nanotubes, semiconductor nanowires, two-dimensional semiconductor materials (such as black phosphorus, molybdenum disulfide), or three-dimensional semiconductor materials (such as silicon). However, the present disclosure is not limited thereto. Furthermore, for electron transistors, material 102 is n-doped to make material 102 have electrical properties as n-type semiconductors (e.g., electrons become primary carriers), and for hole-type transistors, material 102 is p-doped to make material 102 have electrical properties as p-type semiconductors (e.g., holes become primary carriers). Material 102 can be doped with a high temperature thermal diffusion technique or an ion implantation technique for example. Material 102 can be formed on substrate 101 with a chemical method (e.g., chemical vapor deposition) or a physical method (e.g., coating). Alternatively, the surface of substrate 101 may also be doped to form material 102. For example, when substrate 101 is silicon on insulator, the silicon may be doped to form material 102. In FIG. 1, material 102 is in direct contact with substrate 101. However, those skilled in the art will understand that other layers or elements may be present between material 102 and substrate 101.

Also provided on substrate 101 is Dirac material 103 for forming a source. The Dirac material described herein means that the low-energy electron excitation of the material acts like a Dirac particle. That is, the low-energy electron excitation of the material can be described with the Dirac equation. The electronic density of Dirac material 103 is a decreasing function of energy, and the electron density decreases super-exponentially as the energy increases. For example, Dirac material 103 can comprise: a single layer of graphene, a Weyl semi-metal, a d-wave superconductor, or a topological insulator. It will be understood by those ordinary skilled in the art that the present disclosure only gives partial examples of Dirac material 103, and does not list all materials that can be used as Dirac material 103 exhaustively, and the present disclosure is not limited thereto. Additionally, as shown in FIG. 1, Dirac material 103 is in electrical contact with material 102. Although it is shown that Dirac material 103 is placed side by side and in contact with material 102 in FIG. 1, Dirac material 103 may also overlap with material 102, which is not limited in this disclosure. In the embodiment illustrated in FIG. 1, the drain and the channel are formed of the same layer of material, that is, the drain is also formed of material 102. By forming the drain and the channel with the same layer of material, the manufacturing method of the field effect transistor can be simplified, the cost can be reduced, and the manufacturing duration can be shortened.

Source electrode 105 may be disposed on Dirac material 103, and drain electrode 107 may be disposed on material 102. Source electrode 105 and Drain electrode 107 are formed of a conductive material such as Al, Pd. Source electrode 105 and drain electrode 107 may be formed of the same material or different materials. Source electrode 105 and drain electrode 107 can be formed with processes such as thin film growth, lithography, etching, etc.

Gate insulating layer 104 may be laminated with material 102. For example, gate insulating layer 104 may include $HfO_2$, $Y_2O_3$ or other insulating materials. Gate insulating layer 104 can be formed with a method such as atomic layer deposition. Although FIG. 1 illustrates that gate insulating layer 104 covers only a portion of material 102, it should be understood by those skilled in the art that gate insulating layer 104 may also cover the entire surface of Dirac material 103 and material 102, or that gate insulating layer 104 may cover only the entire surface of material 102 without covering Dirac material 103. When gate insulating layer 104 covers Dirac material 103, source electrode 105 may be in contact with Dirac material 103 through a via hole formed in gate insulating layer 104. When gate insulating layer 104 covers the entire surface of material 102, drain electrode 107 may be in contact with material 102 through a via hole formed in gate insulating layer 104. In addition, the equivalent oxide thickness (EOT) of gate insulating layer 104 may be less than 2 nm. The equivalent oxide thickness described herein means that the thickness of a thin layer of any dielectric material is equated with the thickness of silicon dioxide.

Figure 2:
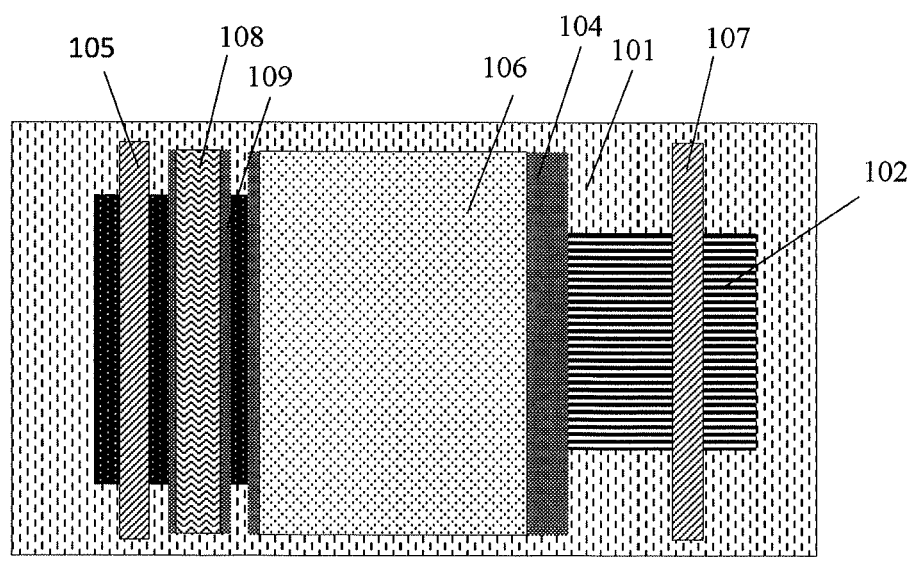
FIG. 2 exemplarily illustrates the top view of a field effect transistor according to an embodiment of the present disclosure.

The gate 106 may be disposed on gate insulating layer 104 and electrically insulated from material 102 by gate insulating layer 104. The projection of gate 106 on material 102 at least partially overlaps with the projection of gate insulating layer 104 on material 102. The projected area of gate 106 on material 102 can be less than or equal to the projected area of gate insulating layer 104 on material 102. For example, it is shown in FIG. 2 that the projected area of gate 106 on material 102 is less than the projected area of gate insulating layer 104 on material 102. Gate 106 may be formed of a conductive material such as Al, Pd. Similarly, gate 106 can be formed with processes such as thin film growth, lithography, etching, etc.

Source control electrode 108 may also be disposed on Dirac material 103. Source control electrode 108 is used for controlling the doping of Dirac material 103 such that Dirac material 103 and channel are doped in an opposite manner.

For example, with regard to electron transistors, source control electrode 108 can modulate Dirac material 103 into a p-type doping by applying a positive voltage to Dirac material 103, while with regard to hole-type transistors, source control electrode 108 can modulate Dirac material 103 into a n-type doping by applying a negative voltage to Dirac material 103, i.e., Dirac material 103 and material 102 are doped in an opposite manner. In an embodiment of the present disclosure, the contact barrier height between doped Dirac material 103 and doped material 102 is less than 0.2 electron volts. Source control electrode 108 is electrically insulated from gate 106. Source control electrode 108, source electrode 105, gate electrode 106 and drain electrode 107 may be formed of the same or different materials, which is not limited in the present disclosure. Similarly, source control electrode 108 can be formed with processes such as thin film growth, lithography, etching, etc.

Source control electrode insulating layer 109 may also be disposed between source control electrode 108 and Dirac material 103, and source control electrode 108 is insulated from Dirac material 103 by source control electrode insulating layer 109. Source control electrode insulating layer 109 may be formed of the same layer of material as gate insulating layer 104. However, those skilled in the art should understand that the source control electrode insulating layer 109 and gate insulating layer 104 may also be formed of different materials, which is not limited in the present disclosure. Further, although it is shown in FIGS. 1-2 that source control electrode insulating layer 109 is not connected to gate insulating layer 104, it will be understood by those skilled in the art that source control electrode insulating layer 109 may also be connected to gate insulating layer 104.

Figure 3:
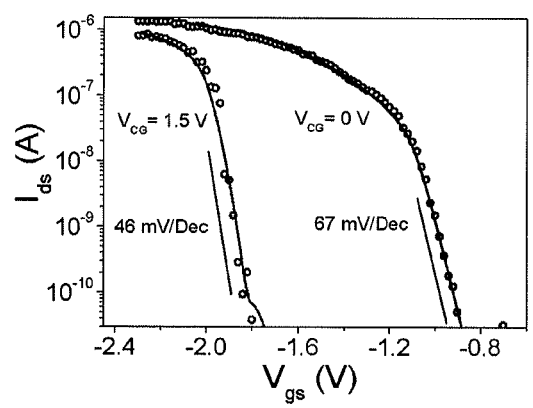
FIG. 3 exemplarily illustrates the transfer curve of an example of a field effect transistor according to an embodiment of the present disclosure.

FIG. 3 illustrates a transfer curve of an example of a field effect transistor according to an embodiment of the present disclosure. Specifically, FIG. 3 illustrates a transfer curve of an example of a field effect transistor according to an embodiment of the present disclosure at room temperature, the transfer curve indicating a relationship between source drain current $I_{ds}$ and gate source voltage $V_{gs}$. The room temperature herein means 300K. The field effect transistor in the embodiment has a structure similar to that shown in FIG. 1. In FIG. 3, with regard to a p-type doped channel material, when a positive voltage is applied to the source control electrode, the source graphene controlled thereby is n-type doped, thereby the SS of the transistor is less than 60 mV/Dec; when a negative voltage or zero voltage is applied, the source graphene controlled thereby is p-type doped, thereby the SS of the transistor is greater than 60 mV/Dec. It can be observed that in the present embodiment, if a positive voltage is applied to the source control electrode, a sub-threshold swing of less than 60 mV/Dec, specifically 46 mV/Dec, can be achieved in the case where the source-drain voltages are −0.5 V and −0.1 V. Thus, a field effect transistor according to an embodiment of the present disclosure can achieve a subthreshold swing which is less than the theoretical minimum value (i.e., 60 mV/Dec) of a subthreshold swing of a conventional field effect transistor at room temperature. Moreover, those skilled in the art should understand that the above sub-threshold swing of 46 mV/Dec is only a sub-threshold swing achieved by one example of a field effect transistor according to an embodiment of the present disclosure. However, a field effect transistor according to an embodiment of the present disclosure can also achieve other sub-threshold swings less than 60 mV/Dec, such as approximately 50 mV/Dec, approximately 46 mV/Dec, approximately 35 mV/Dec.

Figure 4:
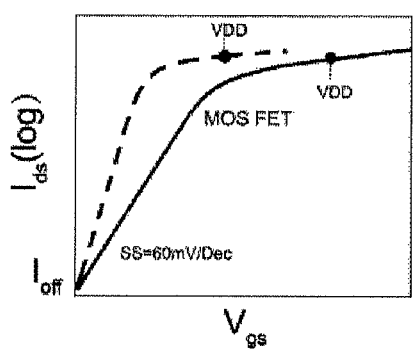
FIG. 4 exemplarily schematically illustrates comparison of the transfer characteristics of a conventional field effect transistor with a field effect transistor according to an embodiment of the present disclosure.

FIG. 4 schematically illustrates comparison of transfer characteristic of a conventional field effect transistor and a field effect transistor according to an embodiment of the present disclosure. In FIG. 4, the solid line represents the transfer characteristic of a conventional field effect transistor having a sub-threshold swing of 60 mV/Dec, and the dashed line represents the transfer characteristic of the field effect transistor according to an embodiment of the present disclosure. Since the field effect transistor according to an embodiment of the present disclosure can obtain a sub-threshold swing of less than 60 mV/Dec, the field effect transistor according to an embodiment of the present disclosure can achieve a operating voltage VDD less than which a conventional field effect transistor can achieve, and an on-state current similar to the magnitude of the on-state current of a conventional field effect transistor. As an example, a field effect transistor according to an embodiment of the present disclosure can achieve an operating voltage of about 0.5 V, which is less than an operating voltage of 0.7 V of a Si MOS FET by the present 14 nm manufacturing process, and achieve an on-state current at an operating voltage of 0.5V, which is approximately equal to the on-state current of Si MOS FET by the present 14 nm manufacturing process.

Compared with the related art, the field effect transistor according to an embodiment of the present disclosure can achieve a sub-threshold swing of less than 60 mV/Dec at room temperature, and can realize a smaller operating voltage, a similar on-state current, as well as a smaller off-state current, reducing power consumption.

Figure 5:
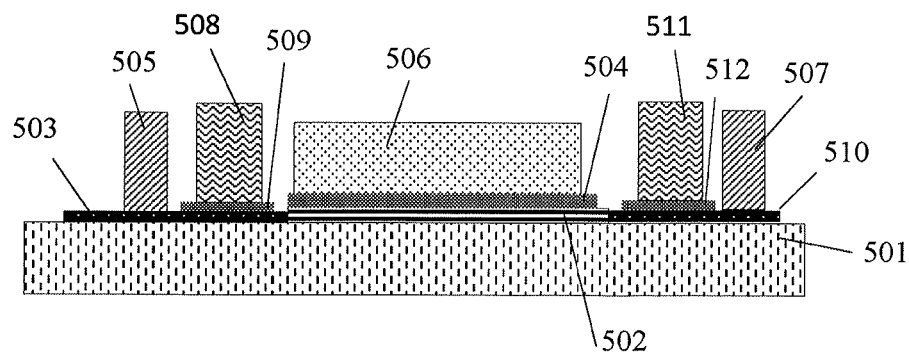
FIG. 5 exemplarily illustrates the schematic diagram of the structure of a field effect transistor according to an embodiment of the present disclosure.

FIG. 5 illustrates the schematic diagram of the structure of a field effect transistor according to an embodiment of the present disclosure. Substrate 501, material 502, Dirac material 503, gate insulating layer 504, source electrode 505, gate 506, drain electrode 507, source control electrode 508, and source control electrode insulating layer 509 are all the same as substrate 101, material 102, Dirac material 103, gate insulating layer 104, source electrode 105, gate electrode 106, drain electrode 107, source control electrode 108, source control electrode insulation layer 109 in FIG. 1, thereby they are not depicted repeatedly herein. In the present embodiment, the field effect transistor further includes Dirac material 510 between drain electrode 507 and substrate 501. Dirac material 510 is used as a drain and is in electrical contact with material 502. In the present embodiment, Dirac material 510 is the same as Dirac material 503. However, those skilled in the art should understand that Dirac material 510 may also be different from Dirac material 503, which is not limited in this disclosure. Drain control electrode 511 and drain control electrode insulating layer 512 are further provided on Dirac material 510, and drain control electrode 511 is electrically insulated from Dirac material 510 through drain control electrode insulating layer 512. Similar to source control electrode 508, drain control electrode 511 is used for controlling the doping of Dirac material 510 such that Dirac material 510 and the channel are doped in an opposite manner. The control of the doping of Dirac material 510 by drain control electrode 511 is similar to the control of the doping of Dirac material 503 by source control electrode 508, which is not described in this disclosure. It should be understood by those skilled in the art that drain control electrode 511 and drain control electrode insulating layer 512 may be formed of the same materials as or different materials from source control electrode 508 and source control electrode insulating layer 509 respectively, which is not described in this disclosure.

Similarly, compared to the related art, a field effect transistor having the structure shown in FIG. 5 can achieve a sub-threshold swing of less than 60 mV/Dec at room temperature, and can achieve a smaller operating voltage, a similar on-state current, and a smaller off-state current, reducing power consumption.

Figure 6:
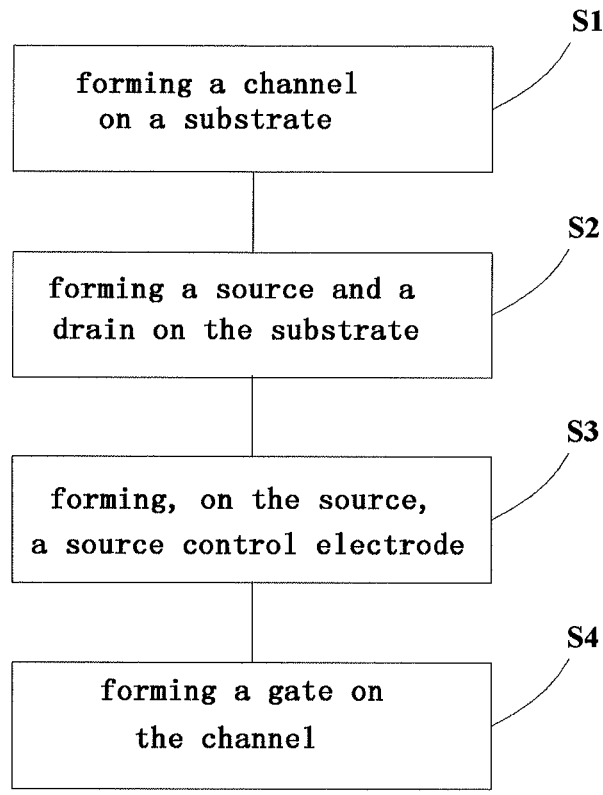
FIG. 6 illustrates the flowchart of a method for manufacturing a field effect transistor according to an embodiment of the present disclosure.

FIG. 6 illustrates the flowchart of a method for manufacturing a field effect transistor according to an embodiment of the present disclosure. A method for manufacturing a field effect transistor having a source control electrode according to an embodiment of the present disclosure, comprises:

S1: forming a channel on a substrate;

S2: forming a source and a drain on the substrate such that the channel is located between the source and the drain, the source being formed of a Dirac material;

S3: forming, on the source, a source control electrode for controlling doping of the Dirac material such that the Dirac material and the channel are doped in an opposite manner; and S4: forming a gate on the channel such that a projection of the gate on the substrate overlaps with a projection of the channel on the substrate, and the gate and the channel are electrically insulated.

Figure 7:
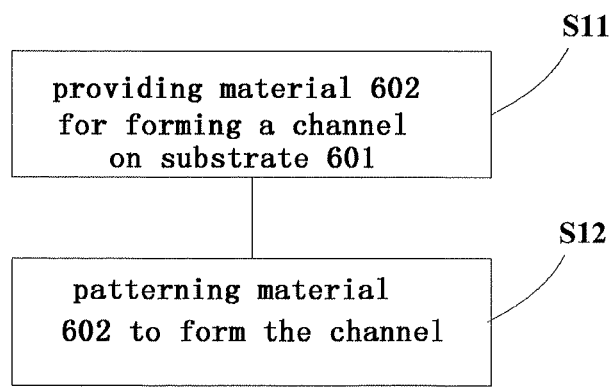
FIG. 7 exemplarily illustrates the flowchart of the step of forming a channel according to an embodiment of the present disclosure.

As shown in FIG. 7, in an embodiment of the present disclosure, the steps of forming a channel on a substrate may include the following sub-steps:

S11: providing material 602 for forming a channel on substrate 601; and

S12: patterning material 602 to form the channel.

Figure 8A:
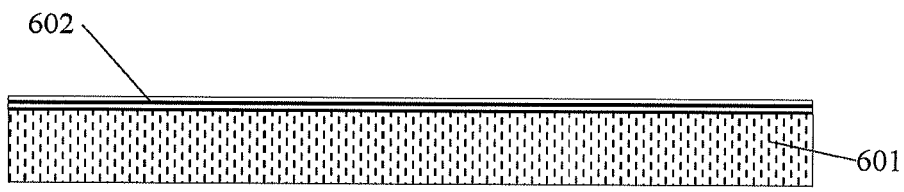
FIG. 8A to FIG. 8B exemplarily illustrates sub-steps of providing a material for forming a channel on a substrate according to an embodiment of the present disclosure.
Figure 8B:
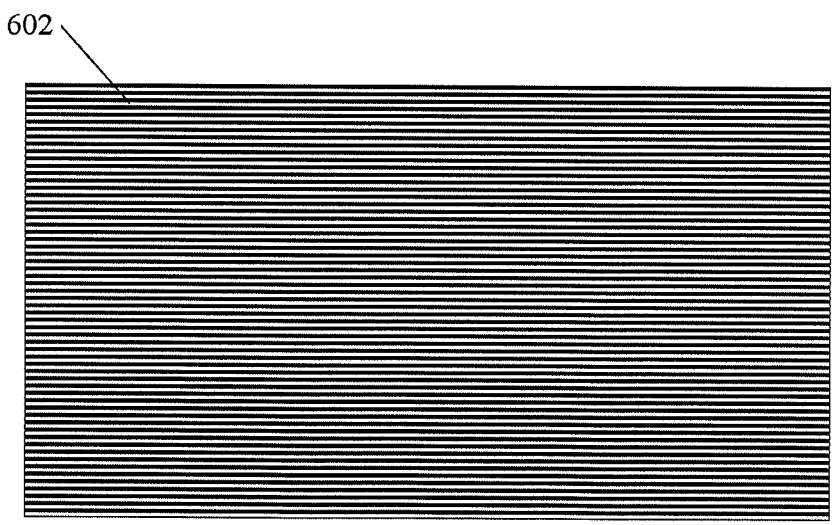
Figure 9A:
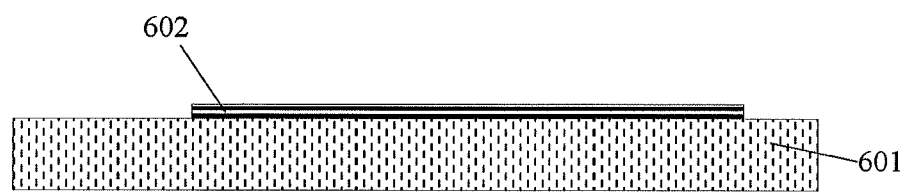
FIGS. 9A-9B exemplarily illustrates the sub-steps of patterning a material to form a channel according to an embodiment of the present disclosure.
Figure 9B:
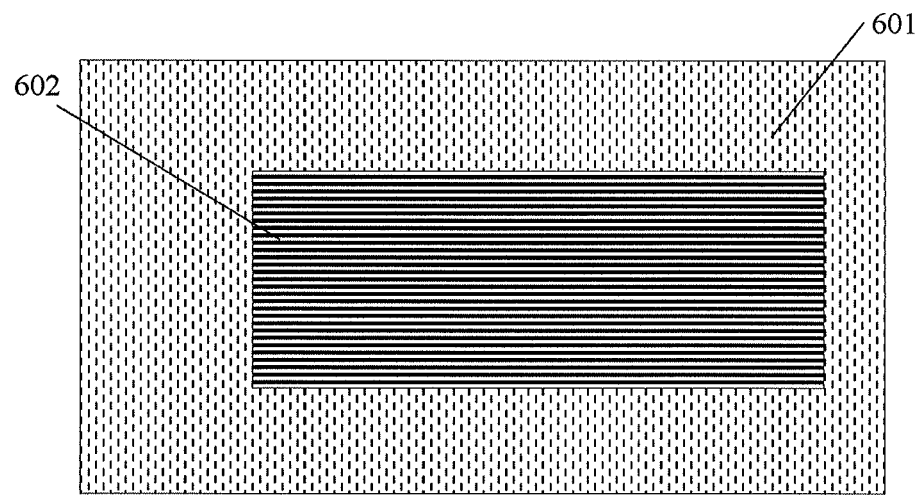

FIGS. 8A-8B exemplarily illustrate the sub-steps of providing a material for forming a channel on a substrate. FIGS. 9A-9B exemplarily illustrate the sub-steps of patterning the material to form a channel. Material 602 can be formed on substrate 601 with chemical methods (e.g., chemical vapor deposition) or physical methods (e.g., coating). Material 602 should have the electrical properties of a semiconductor. For example, material 602 may include carbon nanotubes, semiconductor nanowires, two-dimensional semiconductor materials (such as black phosphorus, molybdenum disulfide), or three-dimensional semiconductor material (such as silicon). However, the disclosure is not limited thereto. In the present embodiment, material 602 may be prepared in advance.

Alternatively, the steps of forming a channel on the substrate can comprise: doping substrate 601 to form material 602 for forming a channel. For example, when substrate 601 is silicon on insulator, silicon may be doped to form material 602. Material 602 can be formed to be in direct contact with substrate 601. However, those skilled in the art should understand that other layers or elements may be present between material 602 and substrate 601.

Figure 10:
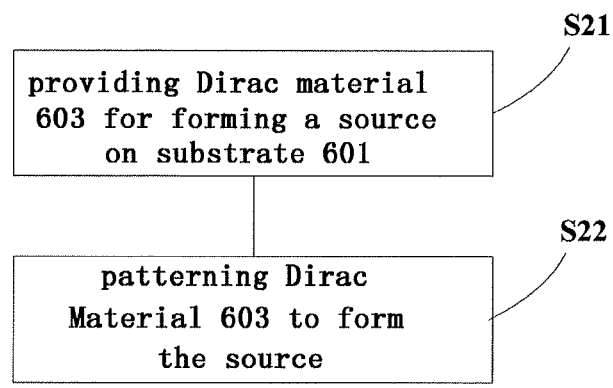
FIG. 10 illustrates the flow chart of the steps of forming a source and a drain on a substrate according to an embodiment of the present disclosure.

As shown in FIG. 10, the steps of forming a source and a drain on the substrate may include the following sub-steps:

S21: providing Dirac material 603 for forming a source on substrate 601; and S22: patterning Dirac Material 603 to form the source.

Figure 11A:
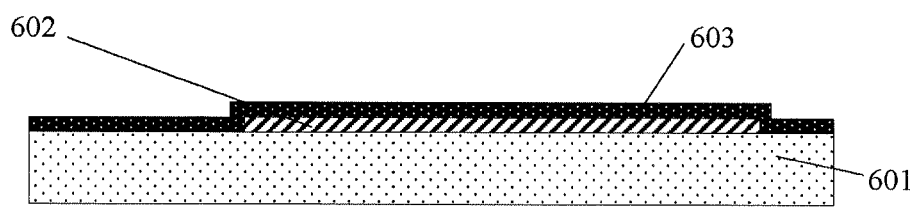
Figure 11B:
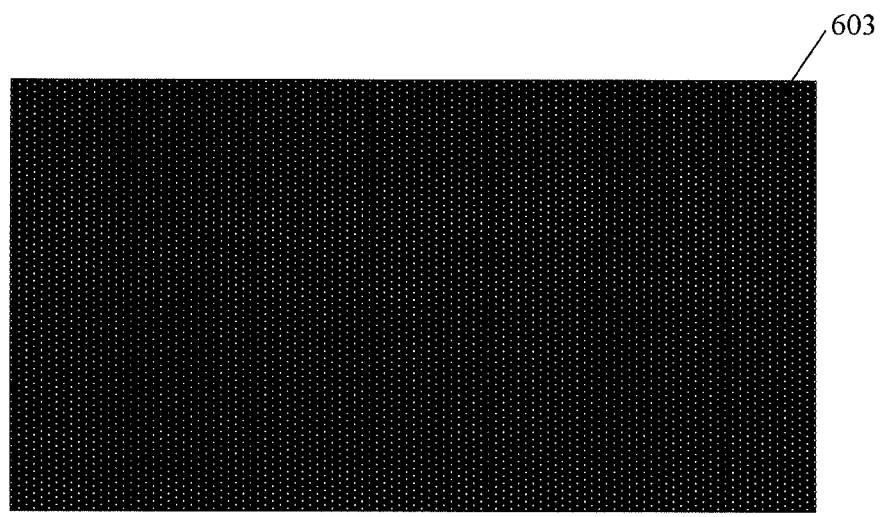
Figure 12A:
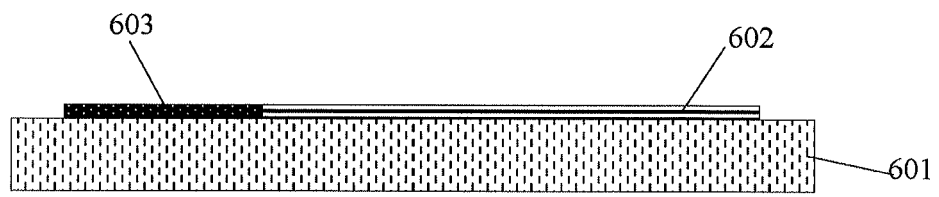
FIGS. 12A-12B exemplarily illustrate the sub-steps of patterning the Dirac material to form a source according to an embodiment of the present disclosure.
Figure 12B:
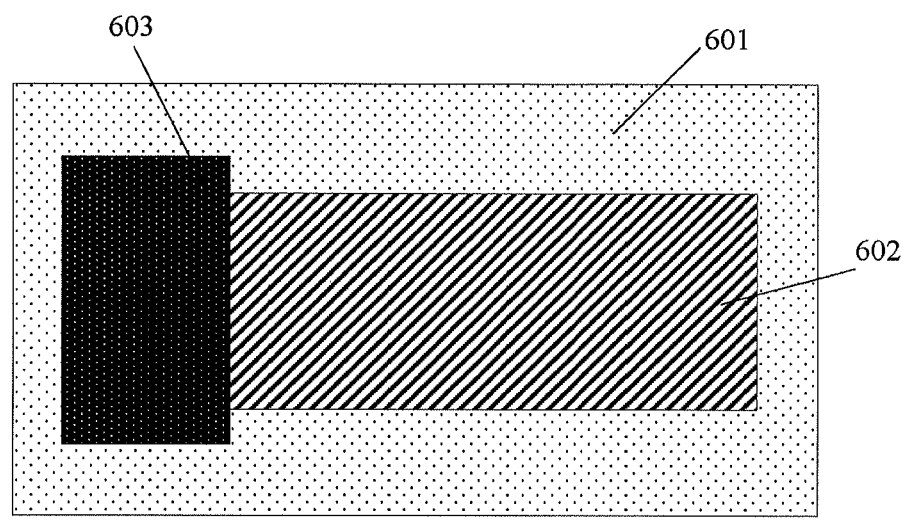

FIGS. 11A-11B exemplarily illustrate the sub-steps of providing the Dirac material for forming the source on a substrate. FIG. 12A-12B exemplarily illustrate the sub-steps of patterning the Dirac material to form a source. In step S22, patterned Dirac material 603 is in electrical contact with material 602.

In the present embodiment, the drain and the channel are formed of the same layer of material, that is, the drain is also made of material 602. In the case where the drain and the channel are formed of the same layer of material, the drain and the channel may be formed in the same step. By forming the drain and the channel with the same layer of material, the method for manufacturing a field effect transistor may be simplified, reducing the cost and shortening the manufacturing duration. However, those skilled in the art should understand that the drain made of a Dirac material may be formed by steps similar to sub-steps S21 and S22, with the drain and the source being formed at both sides of the channel. For example, another layer of Dirac material may be formed on substrate 601, and is patterned to form a drain. The skilled in the art should understand that the source and the drain may be formed of the same or different Dirac materials, which is not limited in the present disclosure. For example, both the source and the drain can be formed of a single layer of grapheme. In the case where the drain and source are formed of the same Dirac material, a drain may be formed of Dirac material 603 in sub-step S22.

Figure 13A:
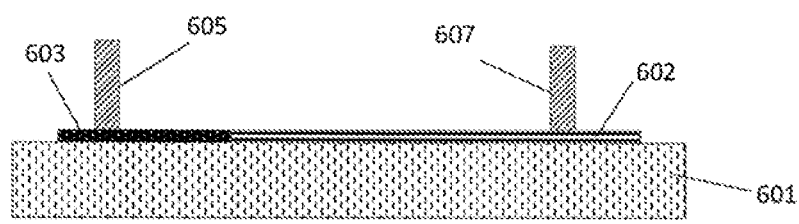
FIGS. 13A-13B exemplarily illustrate the steps of forming a source electrode and a drain electrode in accordance with an embodiment of the present disclosure.
Figure 13B:
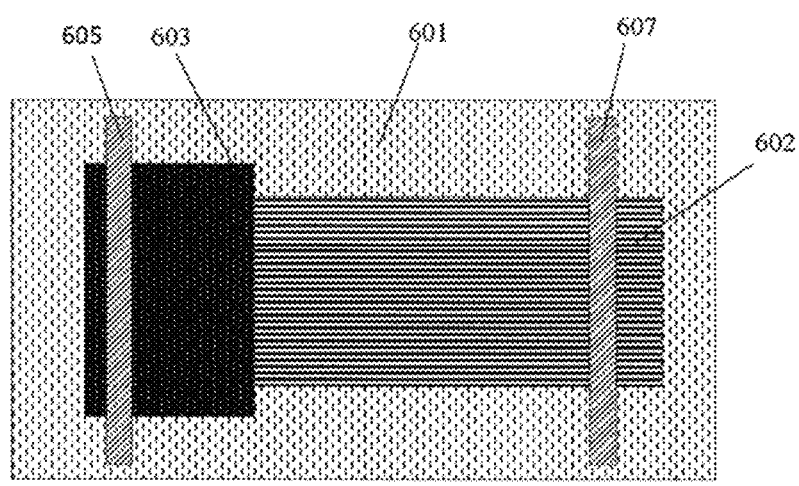

According to an embodiment of the present disclosure, the method may further comprise: forming a source electrode and a drain electrode. FIGS. 13A-13B exemplarily illustrate the steps of forming source electrode 605 and drain electrode 607. The steps can be implemented with processes such as film growth, lithography, etching, etc.

Figure 14A:
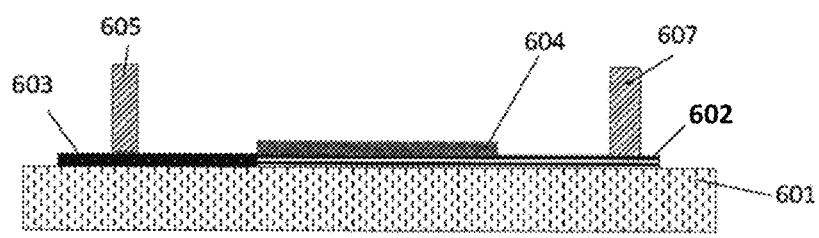
FIGS. 14A-14B exemplarily illustrate the steps of forming a gate insulating layer according to an embodiment of the present disclosure.
Figure 14B:
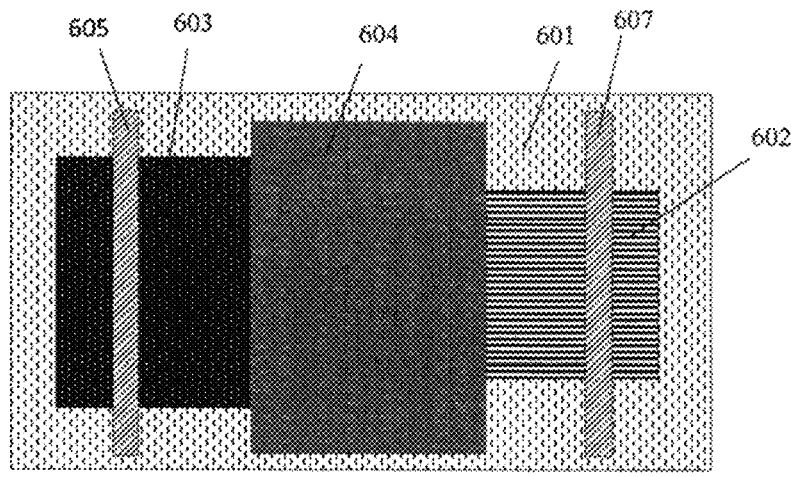

According to an embodiment of the present disclosure, the method may further comprise: forming a gate insulating layer. FIGS. 14A-14B exemplarily illustrate the steps of forming gate insulating layer 604. This step can be implemented by methods such as atom layer deposition. Although FIGS. 14A-14B show that gate insulating layer 604 covers only a portion of material 602, those skilled in the art should understand that that gate insulating layer 604 can also cover the entire surface of Dirac material 603 and material 602, or gate insulating layer 604 may only cover the entire surface of material 602 but does not cover Dirac material 603. When gate insulating layer 604 covers Dirac material 603, source electrode 605 can be in contact with Dirac material 603 via a via hole formed in gate insulating layer 604. When gate insulating layer 604 covers the entire surface of material 602, drain electrode 607 may be in contact with material 602 through a via hole formed in gate insulating layer 604.

Figure 15A:
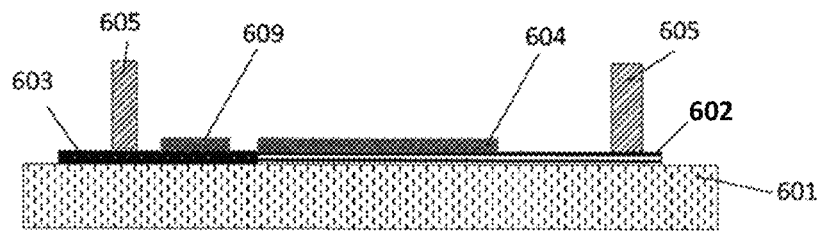
FIGS. 15A-15B exemplarily illustrate the steps of forming a source control electrode insulating layer according to an embodiment of the present disclosure.
Figure 15B:
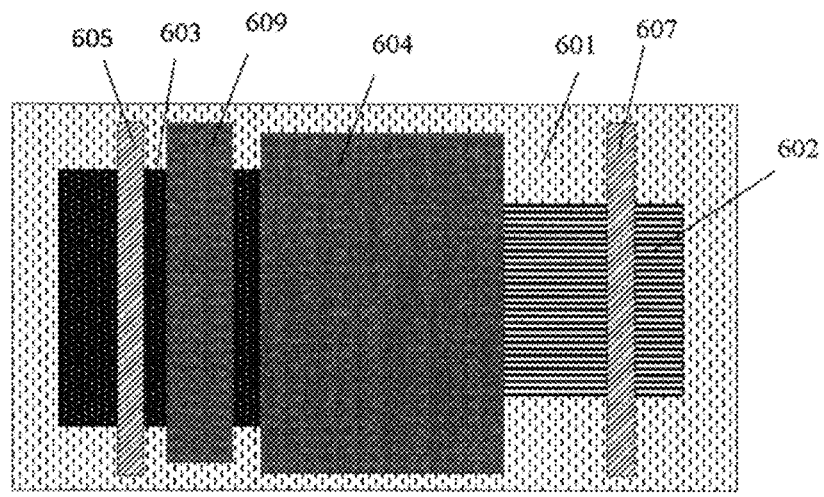

According to an embodiment of the present disclosure, the method may further comprise: forming a source control electrode insulating layer. FIGS. 15A-15B exemplarily illustrate the steps of forming source control electrode insulating layer 609. Similarly, the step can be implemented with a method such as atomic layer deposition, etc. It will be understood by those skilled in the art that source control electrode insulating layer 609 and gate insulating layer 604 may be formed of the same or different materials, which is not limited in the present disclosure. In addition, although FIGS. 15A-15B illustrate that source control electrode insulating layer 609 is not connected to gate insulating layer 604, it should be understood by those skilled in the art that source control electrode insulating layer 609 may also be connected to gate insulating layer 604. For example, source control electrode insulating layer 609 and gate insulating layer 604 may be formed of the same layer of material, and source control electrode insulating layer 609 and gate insulating layer 604 may be formed by the same process.

Figure 16A:
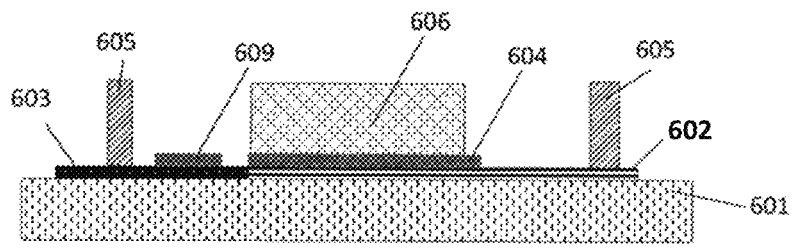
FIGS. 16A-16B exemplarily illustrate the steps of forming a gate according to an embodiment of the present disclosure.
Figure 16B:
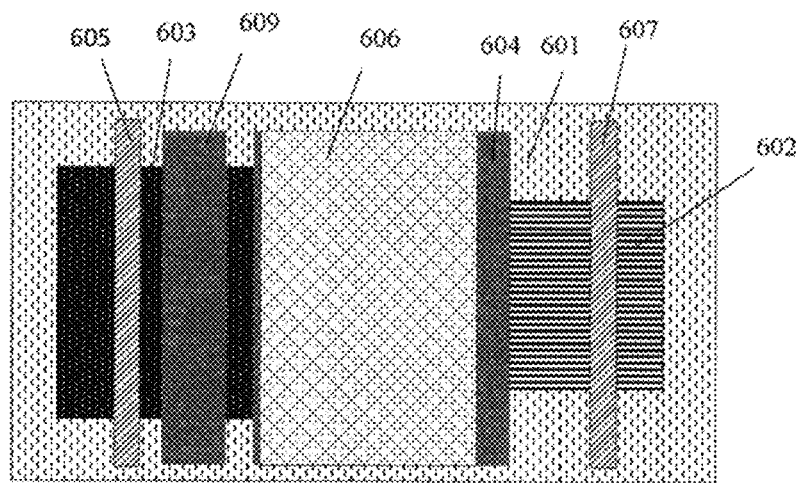

Step S4 will be described in detail below with reference to FIGS. 16A-16B. FIGS. 16A-16B exemplarily illustrate the steps of forming gate 606. Gate 606 can be disposed on gate insulating layer 604 and be electrically insulated from material 602 via gate insulting layer 604. This step can be implemented with the processes such as film growth, lithography, and etching, etc.

The steps of forming the source control electrode on the source will be described below with reference to FIGS.

Figure 17A:
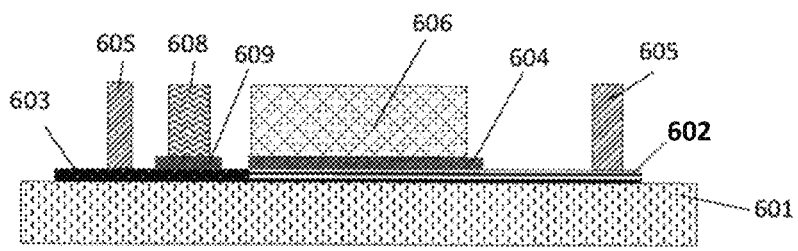
FIGS. 17A-17B exemplarily illustrate the steps of forming a source control electrode according to an embodiment of the present disclosure.
Figure 17B:
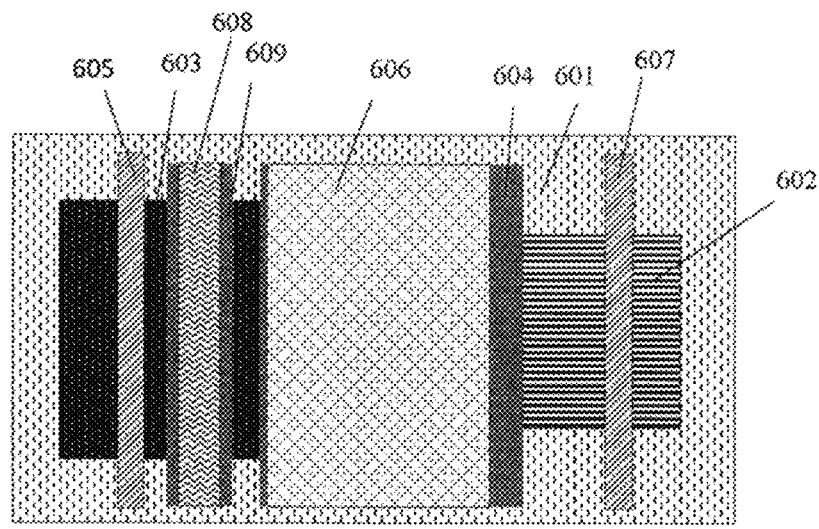

17A-17B. As shown in FIGS. 17A-17B, source control electrode 608 is formed on source control electrode insulating layer 609. Source control electrode 608 is insulated from Dirac material 603 by source control electrode insulating layer 609. Source control electrode 608 is electrically insulated from gate 606. Source control electrode 608 and source electrode 605, gate 606, and drain electrode 607 may be formed of the same or different materials, which is not limited in the present disclosure. Similarly, source control electrode 608 can be formed with processes such as thin film growth, lithography, etching, etc. In operation, source control electrode 608 controls Dirac material 603 and material 102 to be doped in an opposite manner by applying a voltage, and the contact barrier height between doped Dirac material 103 and doped material 102 is less than 0.2 electron volts.

Those skilled in the art should understand that the above substrate 601, material 602, Dirac material 603, gate insulating layer 604, source electrode 605, gate 606, and drain electrode 607 are all the same as substrate 101, material 102, Dirac material 103, gate insulating layer 104, source electrode 105, gate electrode 106, and drain electrode 107 in FIG. 1, thereby they are not depicted repeatedly herein.

Compared with the related art, the field effect transistor according to an embodiment of the present disclosure can achieve a sub-threshold swing of less than 60 mV/Dec at room temperature, and moreover can realize a smaller operating voltage, a similar on-state current, and a smaller off-state current, reducing power consumption.

Those skilled in the art should understand that in some alternative implementations, the steps shown in the flowcharts can be performed in a different order from that shown in the drawings. For example, two successively represented blocks may in fact be executed substantially in parallel, or sometimes in the reverse order depending on actual requirements.

Figure 18:
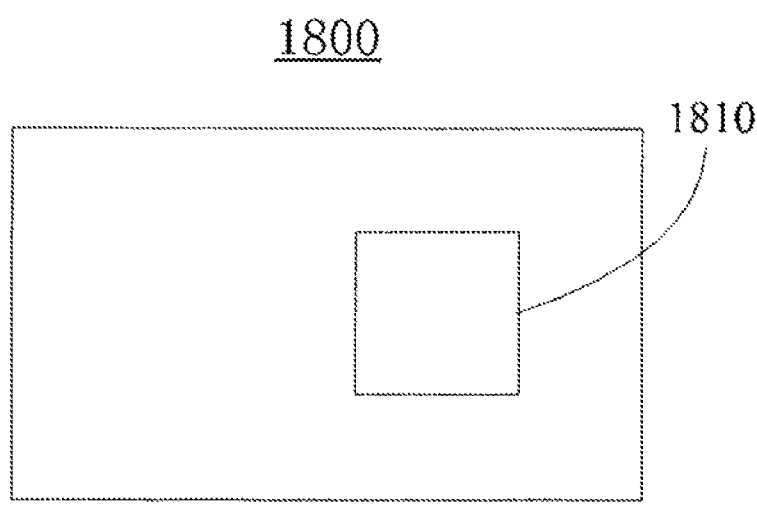
FIG. 18 illustrates a schematic block diagram of an electronic device according to an embodiment of the present disclosure.

FIG. 18 shows a schematic block diagram of an electronic device according to an embodiment of the present disclosure. Field effect transistor 1810 as described above with reference to FIG. 1 or FIG. 5 may be included in electronic device 1800. Electronic device 1800 can be an integrated circuit device, an electronic device, a computer, or the like.

It should be understood by those skilled in the art that the above embodiments are only for the purpose of clearly describing the disclosure, and not intended to limit the scope of the disclosure. Other variations or modifications may be made by those skilled in the art based on the above disclosure, and such changes or modifications are still within the scope of the present disclosure.

The invention claimed is:

1. A field effect transistor having a source control electrode, comprises:
    a source and a drain, the source being formed of a Dirac material;
    a channel disposed between the source and the drain;
    a source electrode and the source control electrode that are disposed on the source, wherein the source control electrode is configured to apply a voltage on the Dirac material of the source to control doping of the Dirac material such that the Dirac material and the channel are doped opposite; and
    a gate disposed on the channel and electrically insulated from the channel.

2. The field effect transistor having a source control electrode according to claim 1, wherein the Dirac material comprises: a single layer of graphene, a Weyl semimetal, a d-wave superconductor, or a topological insulator.

3. The field effect transistor having a source control electrode according to claim 1, wherein the source is in electrical contact with the channel.

4. The field effect transistor having a source control electrode according to claim 3, wherein the source control electrode is configured to cause the contact barrier height between the source and the channel to be less than 0.2 electron volts.

5. The field effect transistor having a source control electrode according to claim 1, wherein,
    the channel is p-type doped, and the source control electrode is configured to cause the Dirac material to be n-type doped; or
    the channel is n-doped, and the source control electrode is configured to cause the Dirac material to be p-type doped.

6. The field effect transistor having a source control electrode according to claim 1, further comprises a gate insulating layer formed on the channel and having an equivalent oxide thickness less than 2 nm.

7. The field effect transistor having a source control electrode according to claim 1, further comprises a source control electrode insulating layer formed between the source and the source control electrode.

8. The field effect transistor having a source control electrode according to claim 6, further comprising a source control electrode insulating layer formed between the source and the source control electrode, the source control electrode insulating layer and the gate insulating layer being formed of the same layer of material.

9. The field effect transistor having a source control electrode according to claim 1, wherein the drain and the channel are formed of the same layer of material.

10. The field effect transistor having a source control electrode according to claim 1, wherein the drain is formed of the Dirac material.

11. The field effect transistor having a source control electrode according to claim 1, wherein the channel is formed of at least one of carbon nanotubes, semiconductor nanowires, two-dimensional semiconductor materials, or three-dimensional semiconductor materials.

12. A method for manufacturing a field effect transistor having a source control electrode, comprises:
    forming a channel on a substrate;
    forming a source and a drain on the substrate such that the channel is located between the source and the drain, the source being formed of a Dirac material;
    forming a source electrode on the source;
    forming, on the source, a source control electrode that is configured to apply a voltage on the Dirac material to control doping of the Dirac material such that the Dirac material and the channel are doped in an opposite manner; and
    forming a gate on the channel such that a projection of the gate on the substrate overlaps with a projection of the channel on the substrate, and the gate and the channel are electrically insulated.

13. The method according to claim 12, wherein the Dirac material comprises: a single layer of graphene, a Weyl semimetal, a d-wave superconductor, or a topological insulator.

14. The method according to claim 12, wherein the step of forming a source and a drain on the substrate further comprises electrically contacting the source with the channel.

15. The method according to claim 14, wherein the source control electrode is configured to cause the contact barrier height between the source and the channel to be less than 0.2 electron volts.

16. The method according to claim 12, wherein,
the channel is p-type doped, and the source control electrode is configured to cause the Dirac material to be n-type doped; or
the channel is n-doped, and the source control electrode is configured to cause the Dirac material to be p-type doped.

17. The method according to claim 12, further comprises: forming a gate insulating layer on the channel, the gate insulating layer having an equivalent oxide thickness less than 2 nm.

18. The method according to claim 12, further comprises: forming a source control electrode insulating layer over the source, the source control electrode insulating layer being disposed between the source and the source control electrode.

19. The method according to claim 17, further comprises: forming a source control electrode insulating layer over the source, the source control electrode insulating layer being formed between the source and the source control electrode, and the source control electrode insulating layer and the gate insulating layer being formed of the same layer of material.

20. The method according to claim 12, wherein the drain and the channel are formed of the same layer of material.

21. The method according to claim 12, wherein the drain is formed of the Dirac material.

22. The method according to claim 12, wherein the channel is formed of at least one of carbon nanotubes, semiconductor nanowires, two dimensional semiconductor materials, or three-dimensional semiconductor materials.

23. An electronic device comprising a field effect transistor having a source control electrode, the field effect transistor having a source control electrode comprising:
a source and a drain, the source being formed of a Dirac material;
a channel disposed between the source and the drain;
a source electrode and a source control electrode that are disposed on the source, wherein the source control electrode is configured to apply a voltage on the Dirac material of the source to control doping of the Dirac material such that the Dirac material and the channel are doped in an opposite manner; and a gate disposed on the channel and electrically insulated from the channel.

* * * * *